United States Patent
Seetharam (10) Patent No.: US 8,558,398 B1
(45) Date of Patent: Oct. 15, 2013

(54) BOND WIRE ARRANGEMENT FOR MINIMIZING CROSSTALK

(71) Applicant: Avago Technologies General IP (Singapore) Pte. Ltd., Singapore (SG)

(72) Inventor: Venkatesh Seetharam, Fremont, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 13/656,858

(22) Filed: Oct. 22, 2012

(51) Int. Cl.
*H01L 23/52* (2006.01)

(52) U.S. Cl.
USPC .......................................... 257/784; 438/617

(58) Field of Classification Search
USPC ................. 257/721, 728, 734, 738, 781, 784; 438/618
See application file for complete search history.

(56) References Cited

U.S. PATENT DOCUMENTS

| | | | |
|---|---|---|---|
| 6,812,580 B1 | 11/2004 | Wenzel et al. | |
| 6,882,047 B2 * | 4/2005 | Hata et al. | 257/734 |
| 7,002,249 B2 | 2/2006 | Duffy et al. | |
| 8,334,201 B2 * | 12/2012 | Katou | 438/612 |
| 2001/0017411 A1 * | 8/2001 | Terui | 257/734 |
| 2002/0043717 A1 * | 4/2002 | Ishida et al. | 257/723 |
| 2005/0263861 A1 | 12/2005 | Ahn et al. | |
| 2006/0006510 A1 | 1/2006 | Koduri | |
| 2011/0140253 A1 | 6/2011 | Lee et al. | |
| 2011/0140287 A1 * | 6/2011 | Bathan et al. | 257/784 |
| 2012/0211903 A1 * | 8/2012 | Kawase | 257/784 |

* cited by examiner

*Primary Examiner* — Nathan Ha (57) ABSTRACT

A lead frame assembly for an integrated circuit package includes a lead frame, a die, first and second information signal-carrying bond wires, first and second ground bond wires, and first and second ground down bond wires. Each ground bond wire shares a die pad with one of the ground down bond wires.

8 Claims, 7 Drawing Sheets

BOND WIRE ARRANGEMENT FOR MINIMIZING CROSSTALK

BACKGROUND

In several types of integrated circuit (IC) packaging technologies, the die is mounted on a portion of the upper surface of a lead frame referred to as the die-attach region, and wire bonds electrically connect pads on the die to areas known as pins on regions of the lead frame surrounding the die-attach region. For example, in a quad-flat no-lead (QFN) package, a lead frame assembly of this type is encapsulated in plastic, and the pins, which are distributed about the four sides of the package, extend to the lower surface of the package to define landing pads that are surface-mountable to a printed circuit board.

Figure 1:
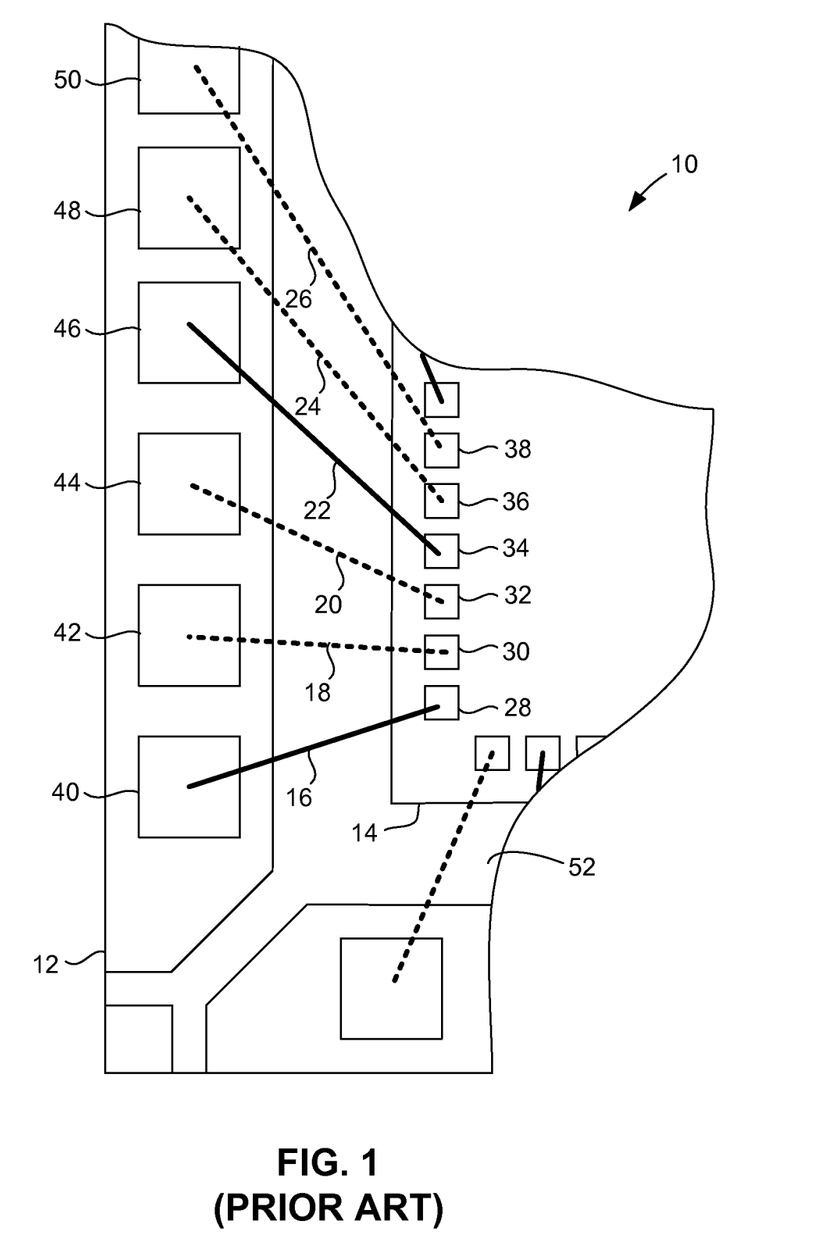
FIG. 1 is a plan view of a portion of a lead frame assembly, in accordance with the prior art.

As illustrated in FIG. 1, a lead frame assembly 10 of a conventional QFN package includes a lead frame 12 on which a die 14 is mounted. In an exemplary portion of lead frame assembly 10, bond wires 16, 18, 20, 22, 24 and 26 connect die pads 28, 30, 32, 34, 36 and 38 to pins 40, 42, 44, 46, 48 and 50, respectively. Only a portion of the rectangular lead frame assembly 10 is shown in FIG. 1 for purposes of clarity, and a similar arrangement of bond wires, die pads and pins exists on each of the four sides of lead frame assembly 10. Lead frame 12 can also include a ground paddle region 52 that is maintained at a ground potential during operation.

Signal crosstalk is a common problem in IC packages of the above-described type. Such crosstalk is commonly caused by electromagnetic coupling of signals between bond wires that are in close proximity with each other. To inhibit such crosstalk, it is known to interpose ground bond wires between information signal-carrying bond wires susceptible to crosstalk with each other. For example, as illustrated in FIG. 1, bond wire 22 is maintained at ground potential (as indicated by its depiction in solid line as a contrast with broken line) to inhibit crosstalk between the differential pair of bond wires 18 and 20 and the differential pair of bond wires 24 and 26, which carry information signals (as indicated by their depiction in broken line as a contrast with solid line). Note that information signal-carrying bond wires are commonly paired in instances in which signals are differential rather than single-ended. However, the same principle of interposing a ground bond wire between otherwise adjacent information signal-carrying bond wires applies in an instance (not shown) in which signals are single-ended. Bond wires 22 and 16 are disposed on either side of the differential pair of bond wires 18 and 20 to inhibit crosstalk between the differential pair of bond wires 18 and 20 and other bond wires.

A shortcoming of the above-described use of ground bond wires to inhibit crosstalk is that maintaining some of the pins at ground potential limits the number of pins available to carry information signals. Increasing the total number of pins so that more pins are available for ground bond wires increases the outside dimensions of the QFN package. That is, if the total number of pins is increased, each of the four sides must be lengthened to accommodate the additional pins. As it is highly desirable to minimize package size, alternatives to maintaining many pins at ground potential have been developed.

Figure 2:
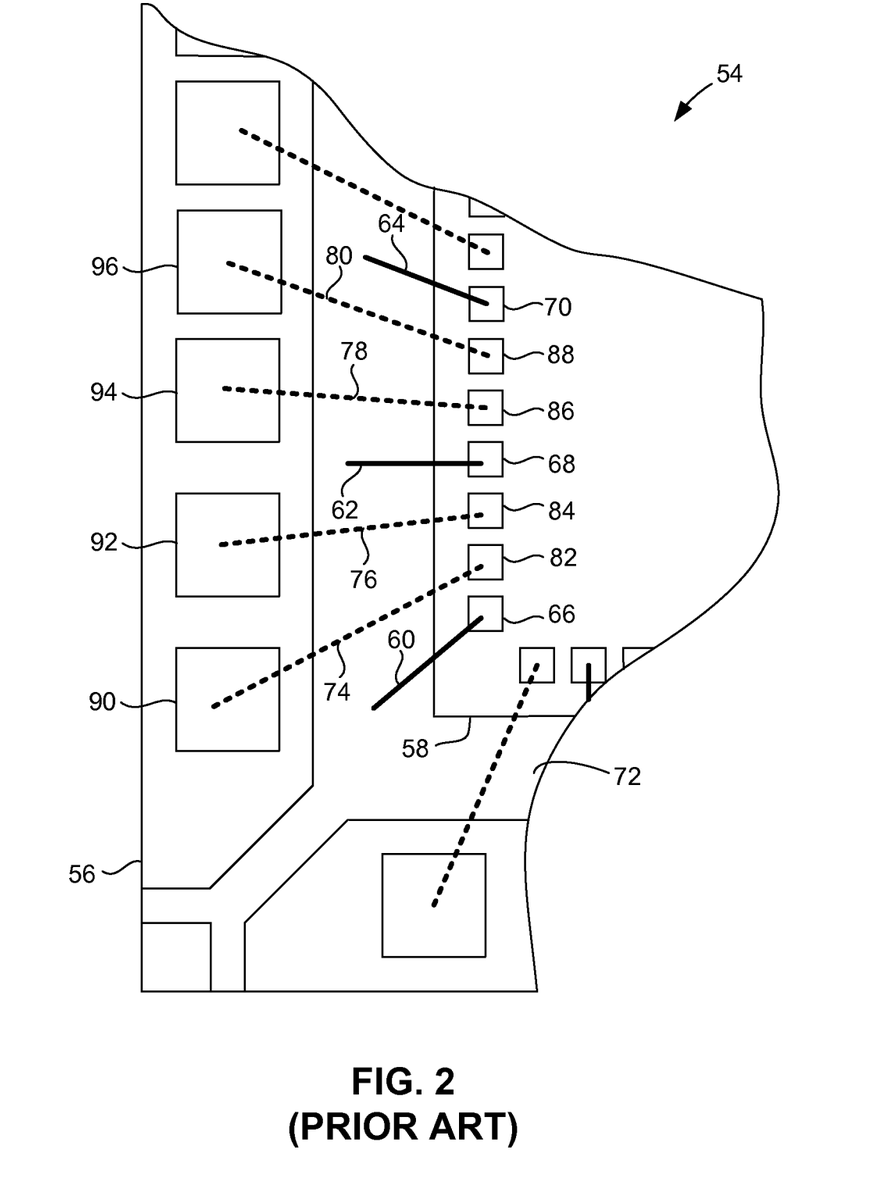
FIG. 2 is a plan view of a portion of another lead frame assembly, in accordance with the prior art.

As illustrated in FIG. 2, a lead frame assembly 54 of a conventional QFN package includes a lead frame 56 on which a die 58 is mounted. In an exemplary portion of lead frame assembly 54, so-called "down" bond wires 60, 62 and 64 connect die pads 66, 68 and 70 to the ground paddle region 72 of lead frame 56. As down bond wires 60, 62 and 64 are not connected to pins, all or many of the pins of lead frame 56 (most of which are not shown in FIG. 2 for purposes of clarity) are available to carry information signals. Such information signals are carried by bond wires 74, 76, 78 and 80 which connect die pads 82, 84, 86 and 88 to pins 90, 92, 94 and 96. In a manner similar to that described above with regard to FIG. 1, down bond wire 62, for example, inhibits crosstalk between a differential pair of bond wires 74 and 76 and a differential pair of bond wires 78 and 80.

It has been found that ground down bond wires (FIG. 2) do not inhibit crosstalk to as great an extent as ground pin bond wires (FIG. 1). It has been theorized that because ground down bond wires do not extend all the way from the die pads to the pins, some electromagnetic signal coupling (i.e., crosstalk) can occur in the region where the information signal-carrying pins are immediately adjacent one another. Such crosstalk may not occur to as great an extent in an arrangement (FIG. 1) in which a ground pin bond wire and ground pin are fully interposed between the information signal-carrying bond wires and corresponding pins that are otherwise susceptible to crosstalk. However, as described above, it is desirable to minimize the number of ground pins so that the number of signal pins can be maximized without increasing package dimensions.

Although the above-described conventional bond wire arrangements help minimize crosstalk, crosstalk can remain problematic in some instances. It would be desirable to provide an improved bond wire arrangement that further inhibits crosstalk without providing an excessive number of ground pins.

SUMMARY

Exemplary embodiments of the present invention relate to a lead frame assembly for an integrated circuit package that includes a lead frame, a die, first and second information signal-carrying bond wires, first and second ground bond wires, and first and second ground down bond wires. Each ground bond wire shares a die pad with one of the ground down bond wires.

The lead frame has a die-attach region, a plurality of pins defining a pin array, and a ground paddle region between the die-attach region and the pin array. The die is mounted on the die-attach region of the lead frame. The die has a plurality of die pads defining a die pad array parallel to the pin array. The first information signal-carrying bond wire has a first end connected to a first signal die pad of the die. The first information signal-carrying bond wire extends across the ground paddle region and has a second end connected to a first signal pin of the lead frame. The second information signal-carrying bond wire has a first end connected to a second signal die pad of the die. The second information-carrying bond wire extends across the ground paddle region and has a second end connected to a second signal pin of the lead frame. The first ground bond wire has a first end connected to a first ground die pad of the die interposed in the die pad array between the first signal die pad and second signal die pad. The first ground bond wire extends across the ground paddle region and has a second end connected to a first ground pin of the lead frame interposed in the pin array between the first signal pin and the second signal pin. A first ground down bond wire has a first end connected to the first ground die pad and a second end connected to the ground paddle region. A second ground bond wire has a first end connected to a second ground die pad of the die interposed in the die pad array between the first signal die pad and second die pad. The second ground bond wire extends across the ground paddle region and has a second end connected to the first ground pin of the lead frame. The second ground down bond wire has a first end connected to the second ground die pad and a second end connected to the ground paddle region.

In an exemplary method of operation of the above-described lead frame array in an IC package, a first information signal is communicated via the first information signal-carrying bond wire, and a second information signal is communicated via the second information signal-carrying bond wire, while the first and second ground bond wires and first and second ground down bond wires are maintained at a ground potential.

Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

Figure 3:
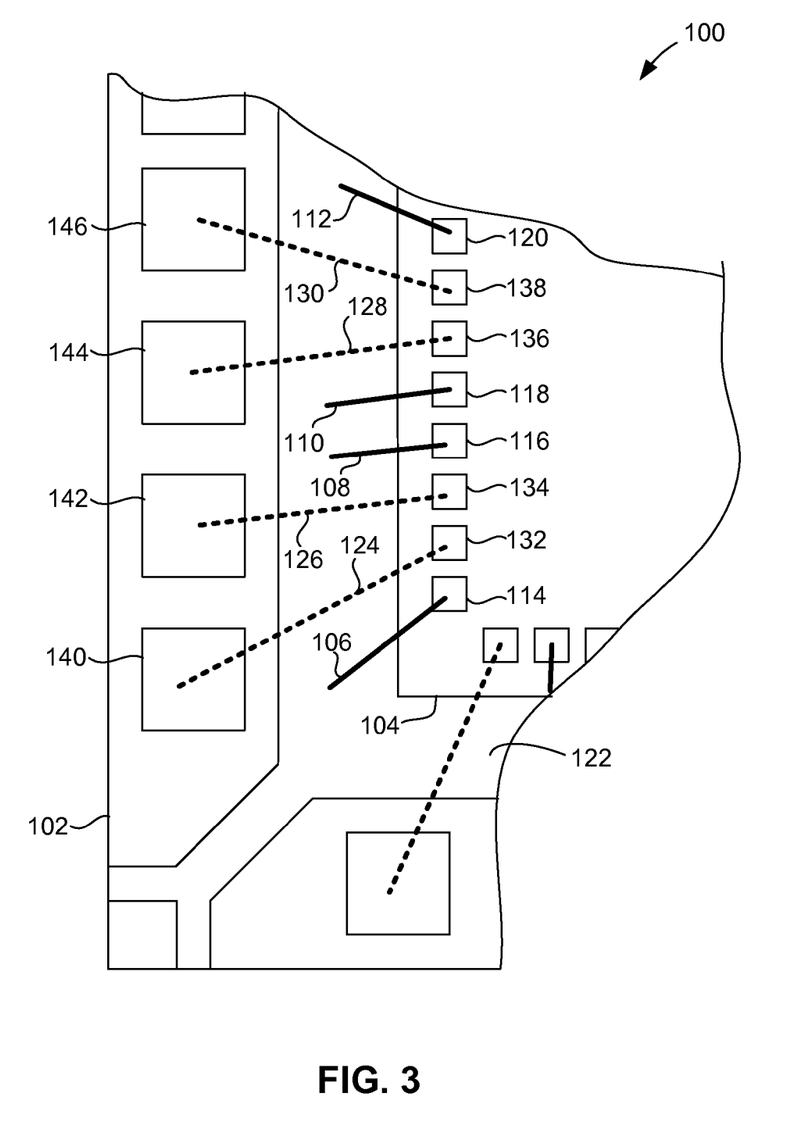
FIG. 3 is a plan view of a portion of a lead frame assembly, in accordance with the present invention.

As illustrated in FIG. 3, a lead frame assembly 100 of a QFN package includes a lead frame 102 on which a die 104 is mounted. In an exemplary portion of lead frame assembly 100, ground down bond wires 106, 108, 110 and 112 connect die pads 114, 116, 118 and 120 to the ground paddle region 122 of lead frame 102. In this exemplary portion of lead frame assembly 100, information signals are carried by signal bond wires 124, 126, 128 and 130, which connect die pads 132, 134, 136 and 138 to pins 140, 142, 144 and 146. Note that a pair of the ground down bond wires 108 and 110 are immediately adjacent one another (i.e., which have no other bond wires interposed between them). Ground down bond wires 108 and 110 are maintained at ground potential. Note that the pair of ground down bond wires 108 and 110 is interposed between a differential pair of signal bond wires 124 and 126 and a differential pair of signal bond wires 128 and 130. Because ground down bond wires 108 and 110 are immediately adjacent one another, the pair of ground down bond wires 108 and 110 inhibits crosstalk between the differential pair of signal bond wires 124 and 126 and the differential pair of signal bond wires 128 and 130 more effectively than a single ground bond wire would inhibit crosstalk between two such differential pairs of bond wires.

Figure 4:
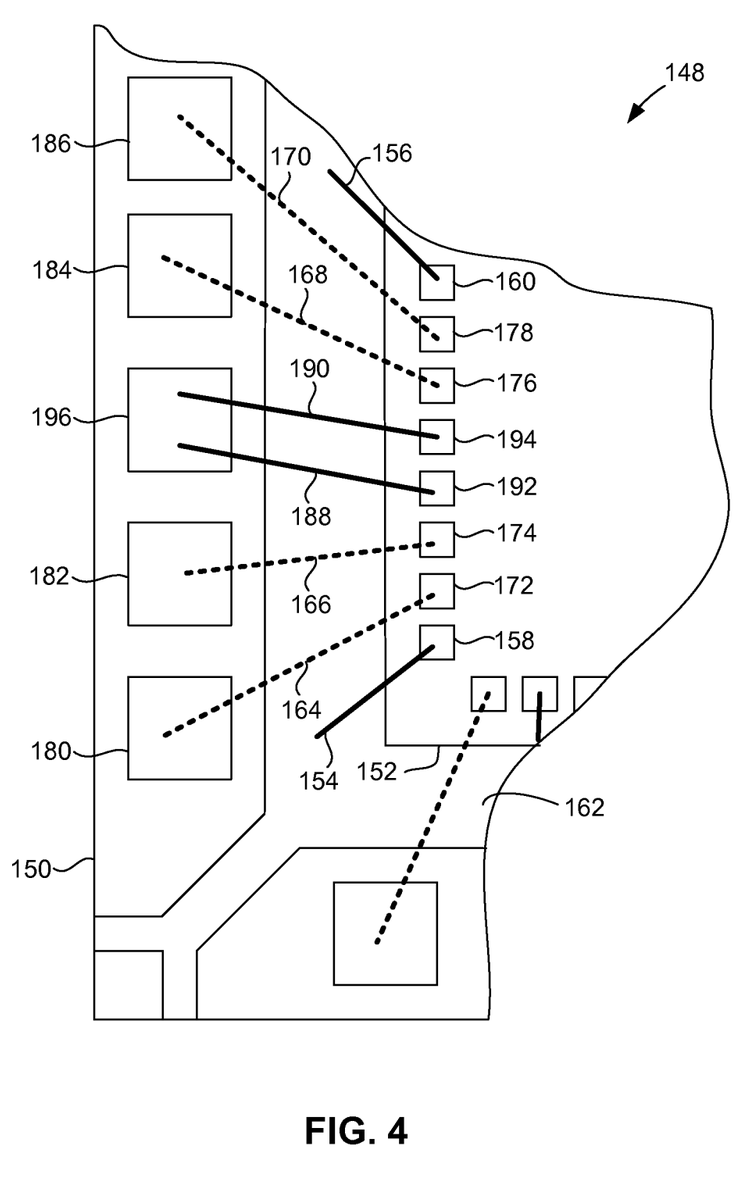
FIG. 4 is a plan view of a portion of another lead frame assembly, in accordance with the present invention.

As illustrated in FIG. 4, a lead frame assembly 148 of a QFN package includes a lead frame 150 on which a die 152 is mounted. In an exemplary portion of lead frame assembly 148, down bond wires 154 and 156 connect die pads 158 and 160 to the ground paddle region 162 of lead frame 150. In this exemplary portion of lead frame assembly 148, information signals are carried by signal bond wires 164, 166, 168 and 170, which connect die pads 172, 174, 176 and 178 to pins 180, 182, 184 and 186. A pair of ground bond wires 188 and 190, which are immediately adjacent one another (i.e., which have no other bond wires interposed between them), connect a corresponding pair of die pads 192 and 194 to a common or shared ground pin 196. Ground bond wires 188 and 190 are maintained at ground potential. Note that the pair of ground bond wires 188 and 190 is interposed between a differential pair of signal bond wires 164 and 166 and a differential pair of signal bond wires 168 and 170. Because ground bond wires 188 and 190 are immediately adjacent one another, conventional wisdom would suggest that the pair of ground bond wires 188 and 190 would inhibit crosstalk between the differential pair of signal bond wires 164 and 166 and the differential pair of signal bond wires 168 and 170 at least as effectively as, if not more effectively than, the pair of ground down bond wires 108 and 110 inhibits crosstalk in the bond wire arrangement described above with regard to FIG. 3. Surprisingly, in accordance with the present invention, it was found that the bond wire arrangement illustrated in FIG. 3 inhibits crosstalk more effectively than the bond wire arrangement illustrated in FIG. 4. That is, an arrangement that uses ground pins and corresponding ground bond wires instead of only ground down bond wires is less effective at inhibiting crosstalk between adjacent differential pairs of signal bond wires.

A comparative analysis between the bond wire arrangements described above with regard to FIGS. 3 and 4 revealed that the apparent anomaly was rooted in overall loop inductance and inductive coupling between adjacent differential pairs of signal bond wires. More specifically, modeling of the electric field (E-field) distributions of lead frame assembly 100 (FIG. 3) and lead frame assembly 148 (FIG. 4) revealed that the E-field in lead frame assembly 148 spread further in all directions from signal bond wires 164, 166, 168 and 170 (FIG. 4) than the E-field in lead frame assembly 100 spread from signal bond wires 124, 126, 128 and 130 (FIG. 3). This difference in E-field spreading is believed to be rooted in loop inductance of the signals and their return paths in each differential pair. Consider the information signals carried on signal bond wires 168 and 166 in lead frame assembly 148 (FIG. 4) and the information signals carried on signal bond wires 126 and 128 in lead frame assembly 100 (FIG. 3). There is a considerably greater loop area formed by the signal and its corresponding return path in the case of bond wires 166 and 168 (FIG. 4) than in the case of bond wires 126 and 128 (FIG. 3). In lead frame assembly 100 (FIG. 3), the presence of ground down bonds 108 and 110 helps provide the shortest path for the return current. Since lowest crosstalk is obtained when the loop inductance formed by the signal and the return path is minimized, lead frame assembly 100 (FIG. 3) provides lower crosstalk than lead frame assembly 148 (FIG. 4). Further analysis led to a focus on regions nearer the die pads than regions nearer the pins. Specifically, greater E-field coupling was observed around the ends of signal bond wires 164, 166, 168 and 170, where they connect to die pads 172, 174, 176 and 178 (FIG. 4) than around the ends of signal bond wires 124, 126, 128 and 130, where they connect to die pads 132, 134, 136 and 138. Replacing ground down bond wires 108 and 110 in FIG. 3 with bond wires 188 and 190 in FIG. 4 increases crosstalk between adjacent differential pairs, thereby defeating the purpose of adding ground pin 196 at lead frame 150 (FIG. 4). The lowering of loop area formed by the signal and return path is believed to explain the observations of greater insertion loss and greater crosstalk in lead frame assembly 148 (FIG. 4) than in lead frame assembly 100 (FIG. 3).

Figure 5:
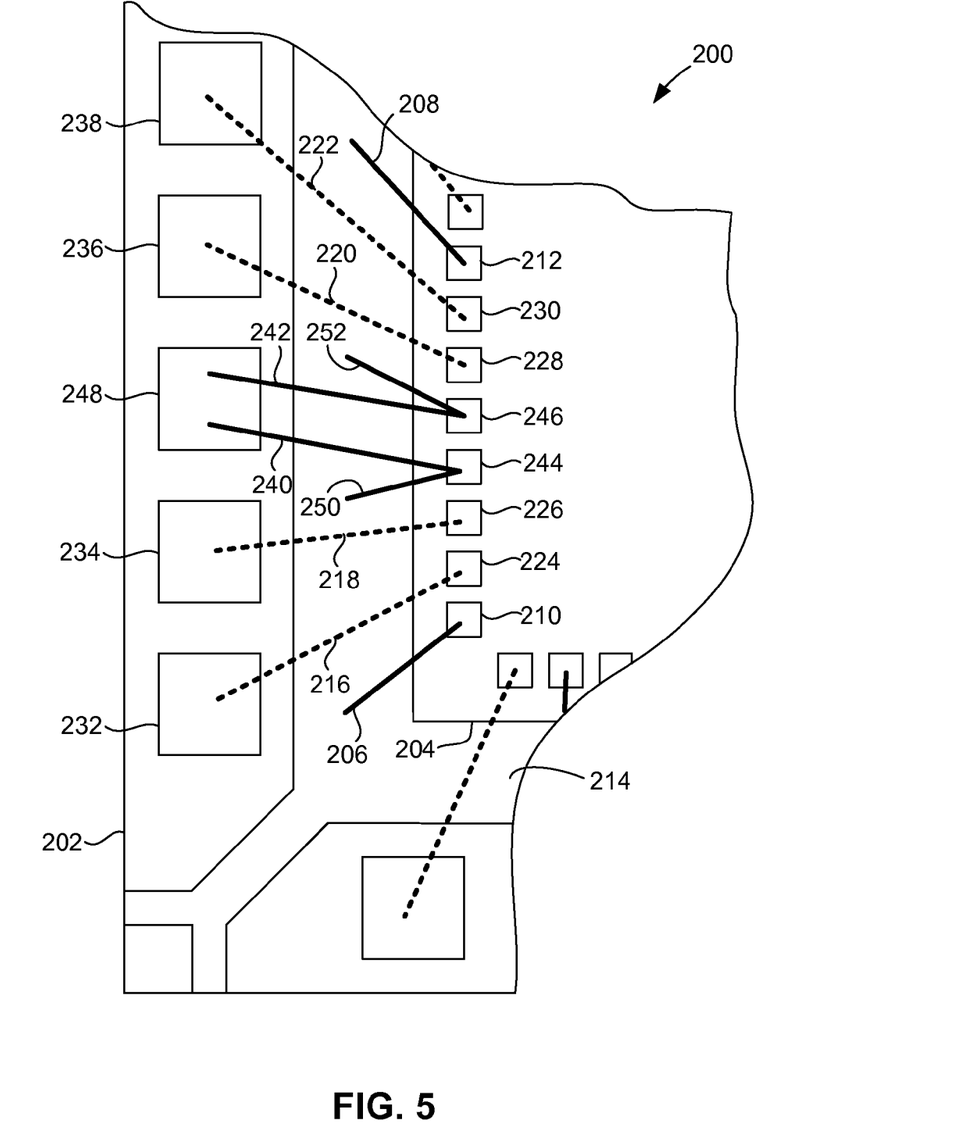
FIG. 5 is a plan view of a portion of still another lead frame assembly, in accordance with the present invention.

As illustrated in FIG. 5, a lead frame assembly 200 of a QFN package includes a lead frame 202 on which a die 204 is mounted. In an exemplary region of lead frame assembly 200, down bond wires 206 and 208 connect die pads 210 and 212 to the ground paddle region 214 of lead frame 202. In this exemplary region of lead frame assembly 200, information signals are carried by signal bond wires 216, 218, 220 and 222, which connect die pads 224, 226, 228 and 230 to pins 232, 234, 236 and 238. A pair of ground bond wires 240 and 242, which are immediately adjacent one another (i.e., which have no other bond wires interposed between them), connect a corresponding pair of die pads 244 and 246 to a common or shared ground pin 248. Ground bond wires 240 and 242 are maintained at ground potential. In addition, a ground down bond wire 250 further connects die pad 244 to ground paddle region 214. Thus, die pad 244 is connected to both ground bond wire 240 and ground down bond wire 250. Likewise, a ground down bond wire 252 further connects die pad 246 to ground paddle region 214. Thus, die pad 246 is connected to both ground bond wire 242 and ground down bond wire 252.

Note that lead frame assembly 200 (FIG. 5) is nearly identical to lead frame assembly 148 (FIG. 4) with the difference being the addition of ground down bond wires 250 and 252. Thus, in lead frame assembly 200 there are four bond wires interposed between a differential pair of signal bond wires 216 and 218 and a differential pair of signal bond wires 220 and 222: ground bond wire 240, ground down bond wire 250, ground bond wire 242, and ground down bond wire 252. Ground down bond wire 250 shares die pad 244 with ground bond wire 240, and ground down bond wire 252 shares die pad 246 with ground bond wire 242. This sharing of die pads in lead frame assembly 200 helps to achieve less coupling than the bond wire arrangements in lead frame assemblies 100 (FIG. 3) and 148 (FIG. 4). This result is achieved because the additional ground down bond wires 250 and 252 (i.e., "additional" to the bond wire arrangement described above with regard to FIG. 4) provides minimal loop area between the signal and return path, thereby reducing the inductive coupling and crosstalk. The additional ground down bond wires 250 and 252 also help to provide isolation between the differential pair of signal bond wires 216 and 218 and the differential pair of signal bond wires 220 and 222 in the region where bond wires 216-222 connect to pins 232-238 by making use of (a common or shared) pin 248. Absent a shared pin such as pin 248, a lead frame assembly (not shown) otherwise having the same bond wire arrangement as lead frame assembly 200 would require two additional die pads to make such a configuration possible, which would require a larger lead frame.

Figure 6:
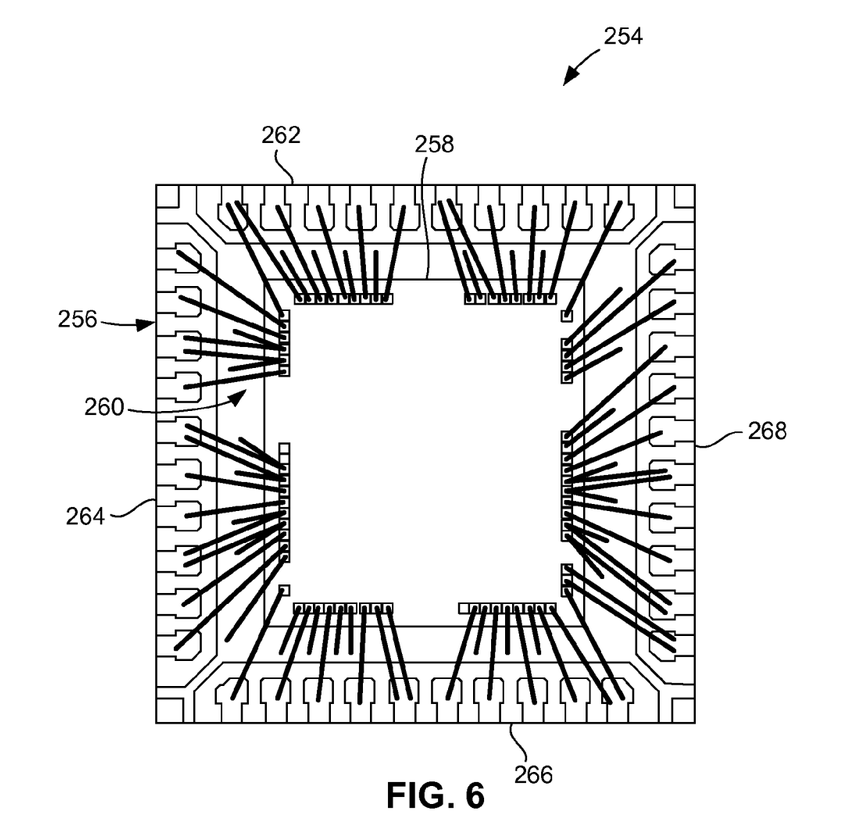
FIG. 6 is a plan view of a lead frame assembly, in accordance with the present invention.
Figure 7:
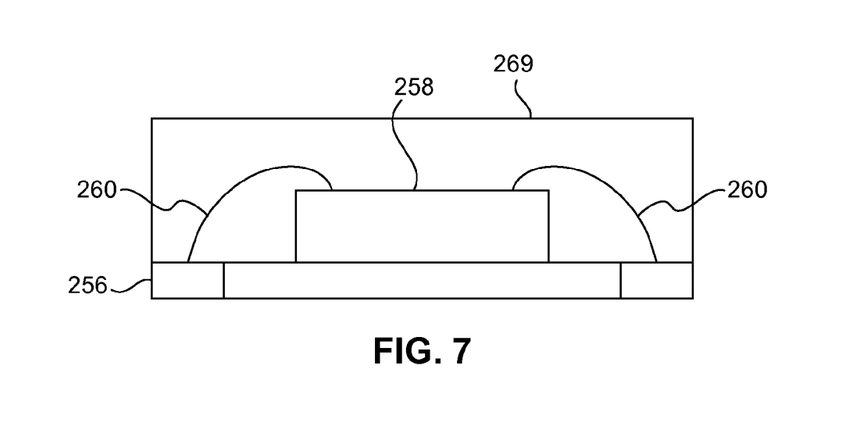
FIG. 7 is a generalized side elevation view of the lead frame assembly of FIG. 6.

It should be understood that, for purposes of clarity, each of FIGS. 1-5 illustrates only a portion of a lead frame assembly. FIG. 6 is intended to illustrate that any suitable portion of a lead frame assembly 254 can include a bond wire arrangement of the type described above with regard to, for example, FIG. 5. Lead frame assembly 254 includes a lead frame 256. A die 258 is mounted on a die-attach region of lead frame 256. Bond wires 260 having an arrangement of the type described above with regard to, for example, FIG. 5, can be arrayed along any one or more of the four sides 262, 264, 266 and 268 of lead frame assembly 254. Note that one or more portions of lead frame assembly 254 can include a bond wire arrangement of the type described above with regard to FIG. 5, while still other portions of lead frame assembly 254 can include one or more other types of bond wire arrangements, such as those described above with regard to FIGS. 3 and 4. Bond wires 260, die 258, and portions of lead frame assembly 254 can be encapsulated in plastic or similar encapsulation 269 to form a QFN package, as illustrated in FIG. 7. However, in other embodiments, lead frame assemblies as described herein can be included in any other suitable type of IC package.

Figure 8:
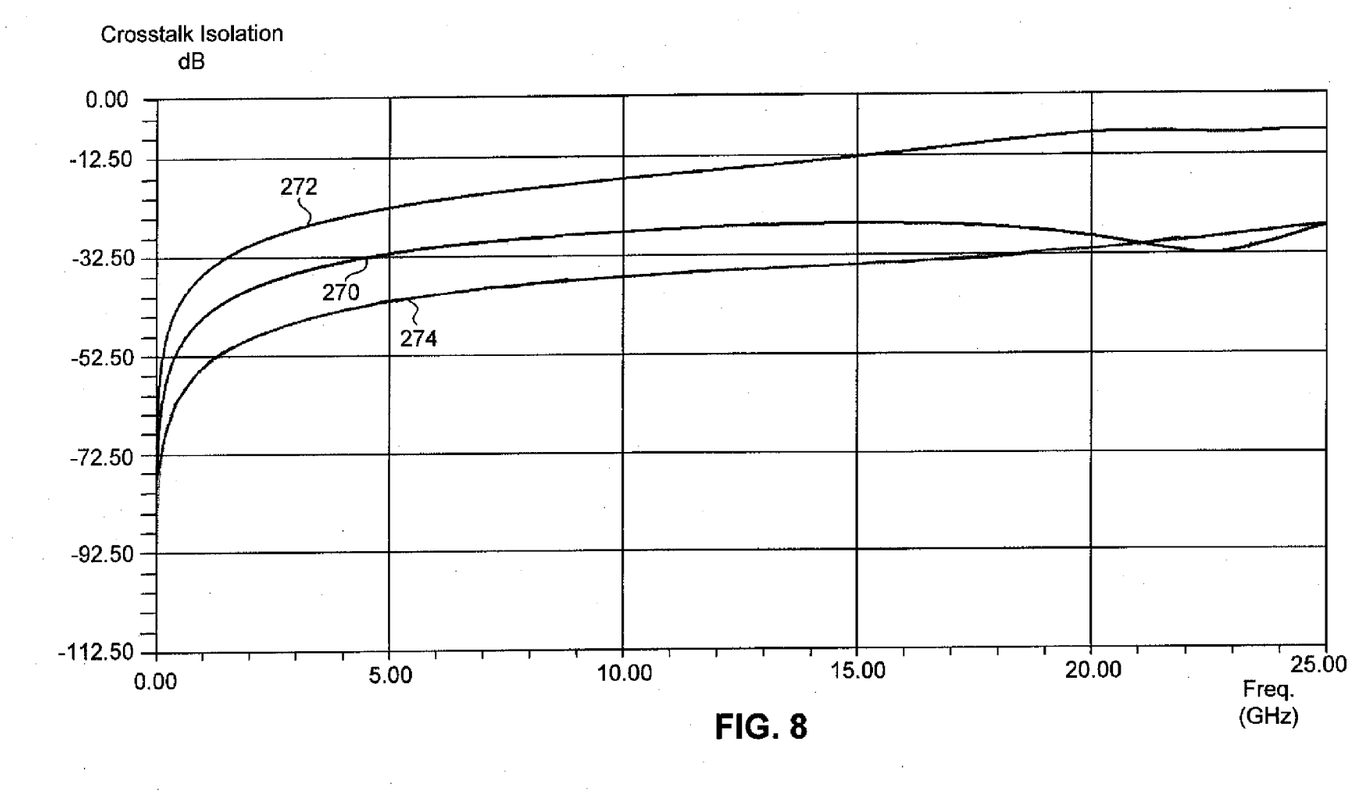
FIG. 8 is a plot comparing crosstalk isolation of lead frame assemblies having the bond wire arrangements shown in FIGS. 3, 4 and 5.

As illustrated in FIG. 8, simulations involving computer models of lead frame assembly 100 (FIG. 3), lead frame assembly 148 (FIG. 4), and lead frame assembly 200 (FIG. 5) result in plots 270, 272 and 274, respectively. Comparing plot 272 with plot 270 indicates that merely adding ground pins and corresponding ground bond wires as described above with regard to FIG. 4 does not reduce crosstalk and actually worsens crosstalk. Rather, it is only by adding ground pins and corresponding ground bond wires in combination with ground down bond wires that share bond pads with the ground bond wires in the manner described above with regard to FIG. 5 that crosstalk is further reduced, as indicated by a comparison of plot 274 with plot 270.

One or more illustrative embodiments of the invention have been described above. However, it is to be understood that the invention is defined by the appended claims and is not limited to the specific embodiments described.

What is claimed is:

1. A lead frame assembly for an integrated circuit package, comprising:
    a lead frame having a die-attach region, a plurality of pins defining a pin array, and a ground paddle region between the die-attach region and the pin array;
    a die mounted on the die-attach region of the lead frame, the die having a plurality of die pads defining a die pad array parallel to the pin array;
    a first information signal-carrying bond wire having a first end connected to a first signal die pad of the die and a second end connected to a first signal pin of the lead frame, the first information signal-carrying bond wire extending across the ground paddle region;
    a second information signal-carrying bond wire having a first end connected to a second signal die pad of the die and a second end connected to a second signal pin of the lead frame, the second information signal-carrying bond wire extending across the ground paddle region;
    a first ground bond wire having a first end connected to a first ground die pad of the die interposed in the die pad array between the first signal die pad and second signal die pad and having a second end connected to a first ground pin of the lead frame interposed in the pin array between the first signal pin and the second signal pin, the first ground bond wire extending across the ground paddle region;
    a first ground down bond wire having a first end connected to the first ground die pad and a second end connected to the ground paddle region;
    a second ground bond wire having a first end connected to a second ground die pad of the die interposed in the die pad array between the first signal die pad and second die pad and having a second end connected to the first ground pin, the second ground bond wire extending across the ground paddle region; and a second ground down bond wire having a first end connected to the second ground die pad and a second end connected to the ground paddle region.

2. The lead frame assembly of claim 1, wherein the die, bond wires and portions of the lead frame are encapsulated in a quad-flat no-lead (QFN) package.

3. The lead frame assembly of claim 1, further comprising a third information signal-carrying bond wire having a first end connected to a third signal die pad of the die and a second end connected to a third signal pin of the lead frame, the third information signal-carrying bond wire extending across the ground paddle region and immediately adjacent the first information signal-carrying bond wire, wherein the first information signal-carrying bond wire and the third information signal-carrying bond wire define a first differential pair.

4. The lead frame assembly of claim 3, further comprising a fourth information signal-carrying bond wire having a first end connected to a fourth signal die pad of the die and a second end connected to a fourth signal pin of the lead frame, the fourth information signal-carrying bond wire extending across the ground paddle region and immediately adjacent the second information signal-carrying bond wire, wherein the second information signal-carrying bond wire and the fourth information signal-carrying bond wire define a second differential pair.

5. A method of operation in a lead frame assembly of an integrated circuit package, the lead frame assembly comprising a lead frame having a die-attach region, a plurality of pins defining a pin array, and a ground paddle region between the die-attach region and the pin array, the lead frame assembly further comprising a die mounted on the die-attach region of the lead frame, the die having a plurality of die pads defining a die pad array parallel to the pin array, the method comprising:

communicating a first information signal via a first information signal-carrying bond wire having a first end connected to a first signal die pad of the die and a second end connected to a first signal pin of the lead frame, the first information signal-carrying bond wire extending across the ground paddle region;

communicating a second information signal a second information signal-carrying bond wire having a first end connected to a second signal die pad of the die and a second end connected to a second signal pin of the lead frame, the second information signal-carrying bond wire extending across the ground paddle region;

maintaining a first ground bond wire at a ground potential, the first ground bond wire having a first end connected to a first ground die pad of the die interposed in the die pad array between the first signal die pad and second signal die pad and having a second end connected to a first ground pin of the lead frame interposed in the pin array between the first signal pin and the second signal pin, the first ground bond wire extending across the ground paddle region;

maintaining a first ground down bond wire at the ground potential, the first ground down bond wire having a first end connected to the first ground die pad and a second end connected to the ground paddle region;

maintaining a second ground bond wire at the ground potential, the second ground bond wire having a first end connected to a second ground die pad of the die interposed in the die pad array between the first signal die pad and second die pad and having a second end connected to the first ground pin, the second ground bond wire extending across the ground paddle region; and maintaining a second ground down bond wire at the ground potential, the second ground down bond wire having a first end connected to the second ground die pad and a second end connected to the ground paddle region.

6. The method of claim 5, wherein the die, bond wires and portions of the lead frame are encapsulated in a quad-flat no-lead (QFN) package.

7. The method of claim 5, further comprising communicating a third information signal via a third information signal-carrying bond wire having a first end connected to a third signal die pad of the die and a second end connected to a third signal pin of the lead frame, the third information signal-carrying bond wire extending across the ground paddle region and immediately adjacent the first information signal-carrying bond wire, wherein the first information signal and the third information signal comprise a first differential information signal.

8. The method of claim 7, further comprising communicating a fourth information signal via a fourth information signal-carrying bond wire having a first end connected to a fourth signal die pad of the die and a second end connected to a fourth signal pin of the lead frame, the fourth information signal-carrying bond wire extending across the ground paddle region and immediately adjacent the second information signal-carrying bond wire, wherein the second information and the fourth information signal define a second differential information signal.

\* \* \* \* \*